(12) United States Patent
Geng

(10) Patent No.: US 11,778,774 B2
(45) Date of Patent: Oct. 3, 2023

(54) PUMPLESS LIQUID-COOLING HEAT DISSIPATOR

(71) Applicant: Dongguan Leading Ship Pump Tech Co;ltd, Dongguan (CN)

(72) Inventor: Xiantao Geng, Dongguan (CN)

(73) Assignee: DONGGUAN LEADING SHIP PUMP TECH CO;LTD, Dongguan (CN)

( * ) Notice: Subject to any disclaimer, the term of this patent is extended or adjusted under 35 U.S.C. 154(b) by 88 days.

(21) Appl. No.: 17/579,623

(22) Filed: Jan. 20, 2022

(65) Prior Publication Data

US 2023/0232574 A1 Jul. 20, 2023

(51) Int. Cl.
*H05K 7/20* (2006.01)

(52) U.S. Cl.
CPC ..... *H05K 7/20245* (2013.01); *H05K 7/20272* (2013.01)

(58) Field of Classification Search
CPC .............. H01L 23/473; F28D 1/05341; H05K 7/20245
See application file for complete search history.

(56) References Cited

U.S. PATENT DOCUMENTS

| | | | | |
|---|---|---|---|---|
| 8,929,073 | B2* | 1/2015 | Suzuki | H05K 1/0201 |
| | | | | 165/104.21 |
| 9,927,181 | B2* | 3/2018 | Mounioloux | G06F 1/20 |
| 10,989,453 | B2* | 4/2021 | Chen | F28D 7/0066 |
| 2005/0051318 | A1* | 3/2005 | Fujita | F28F 9/0282 |
| | | | | 165/173 |
| 2009/0044929 | A1* | 2/2009 | Yeh | F28D 15/00 |
| | | | | 165/104.19 |
| 2019/0339027 | A1* | 11/2019 | Takafuji | F25B 39/00 |

* cited by examiner

*Primary Examiner* — Lionel Nouketcha
(74) *Attorney, Agent, or Firm* — WPAT, P.C

(57) ABSTRACT

A pumpless liquid-cooling heat dissipator includes a cooling head assembly and a condensing assembly. The cooling head assembly and the condensing assembly are connected through the connecting assembly to form a loop. The cooling head assembly and the condensing assembly both are filled with a liquid refrigerant. The use of refrigerant as a cooling medium is more effective compared with the water cooling, has better overall heat dissipation, and can overcome disadvantages of complex wiring of the water-cooling heat dissipator and poor heat dissipation of the heat pipe, and thus can quickly cool down the temperature of component. Compared with the existing water-cooling heat dissipator, the structure is simpler, the circulating cooling can be realized without mechanical drive e.g., water pump, and there is no extension of excess water pipe, which is more convenient for installation and makes the computer case cleaner.

10 Claims, 7 Drawing Sheets

PUMPLESS LIQUID-COOLING HEAT DISSIPATOR

FIELD OF THE DISCLOSURE

The disclosure relates to the field of heat dissipators, and more particularly to a pumpless (also referred to as pump-free) liquid-cooling heat dissipator.

BACKGROUND OF THE DISCLOSURE

With the continuous improvement of computer performance, the heating capacity of central processing unit (CPU) and display core of a computer is increasing. Therefore, a water-cooling heat dissipator or a heat-pipe heat dissipator is more and more popularly used in the computer to quickly dissipate heat for the CPU and the display core.

The water-cooling heat dissipator includes a water-cooling head and a water-cooling array. The water-cooling head is in contact with a heat source such as the CPU or the display core. The water-cooling liquid flowing in the water-cooling head can absorb heat from the heat source, and the water-cooling array can dissipate the heat in the water-cooling liquid to the air. The water-cooling liquid is driven by a liquid pump to circulate between the water-cooling head and the water-cooling array, so that the water-cooling liquid continuously absorbs heat from the heat source and is cooled at the water-cooling array, so as to quickly dissipate heat for the heat source.

The heat-pipe heat dissipator includes a heat pipe and a fin group. The heat pipe absorbs heat from the heat source such as the CPU or the display core through a metal block contact or a direct contact, and conducts the heat to the fin group. The fin group has a large contact area with the air and thus facilitates heat dissipation and thereby provides fast heat dissipation for the heat source. A fan can also be used to drive the air flow in gaps in the fin group to improve the heat dissipation performance.

However, the water-cooling heat dissipator and the heat-pipe heat dissipator still have some shortcomings. For example, although the water-cooling liquid of the water-cooling heat dissipator can fill up the whole water-cooling head thereby achieving a large heat absorption area, the heat absorption performance of the water-cooling liquid itself is not strong enough. In another aspect, although the heat pipe of the heat-pipe heat dissipator uses a refrigerant with strong heat absorption performance as a heat conduction medium, a contact area between the heat pipe and the heat source is insufficient, thereby limiting an overall heat dissipation performance of the heat-pipe heat dissipator.

SUMMARY OF THE DISCLOSURE

An objective of the disclosure is to provide a pumpless liquid-cooling heat dissipator to thereby solve the problems existing in the prior art.

In order to achieve the above-mentioned objective, solutions are provided as follows.

A pumpless liquid-cooling heat dissipator includes a cooling head assembly and a condensing assembly, the cooling head assembly and the condensing assembly are connected through a connecting assembly to form a loop, and the cooling head assembly and the condensing assembly both are filled with a liquid refrigerant (generally liquid cooling medium rather than water).

In an embodiment of the disclosure, the condensing assembly includes a lower tank, an upper tank body and multiple connecting pipes. The lower tank is separated into a first half tank and a second half tank, one half of the multiple connecting pipes connect the first half tank with the upper tank, and the other half of the multiple connecting pipes connect the second half tank with the upper tank. The cooling head assembly is connected with the first half tank and the second half tank of the lower tank individually.

In an embodiment of the disclosure, the connecting assembly is disposed on an outer wall of the lower tank of the condensing assembly, and the connecting assembly is disposed with at least two refrigerant channels connected with the cooling head assembly, some of the at least two refrigerant channels is connected with the first half tank of the lower tank, and the other of the at least two refrigerant channels is connected with the second half tank of the lower tank.

In an embodiment of the disclosure, the condensing assembly further includes multiple first fin groups, which are arranged between adjacent ones of the multiple connecting pipes.

In an embodiment of the disclosure, the condensing assembly further includes a fastener for fastening the multiple connecting pipes and the multiple first fin groups.

In an embodiment of the disclosure, at least one mounting position is formed on the fastener, and a fan is installed on the at least one mounting position.

In an embodiment of the disclosure, an air outlet surface of the fan faces towards the multiple connecting pipes and the multiple first fin groups.

In an embodiment of the disclosure, the cooling head assembly includes a contact plate and a housing formed integrally (also referred to as the contact plate and the housing together form a one-piece structure), the contact plate and the housing together define a space for storing the liquid refrigerant, and a refrigerant outlet and a refrigerant inlet corresponding connected with the at least two refrigerant channels are formed on the housing.

In an embodiment of the disclosure, the connecting assembly includes a connecting part extending downwardly from the outer wall of the lower tank, the at least two refrigerant channels are formed in the connecting part, and the lower tank is fixedly connected to the cooling head assembly.

In an embodiment of the disclosure, a pipe extending to an internal space is arranged at a refrigerant inlet.

In an embodiment of the disclosure, the connecting assembly includes at least two refrigerant pipes.

In an embodiment of the disclosure, the first half tank and the second half tank are respectively threaded with quick-connectors for connecting the at least two refrigerant pipes correspondingly.

In an embodiment of the disclosure, the refrigerant outlet and the refrigerant inlet of the cooling head assembly are respectively inserted with the quick-connectors for connecting the at least two refrigerant channels.

In an embodiment of the disclosure, the contact plate of the cooling head assembly is provided with an inner second fin group.

The beneficial effects of the disclosure are as follows:

The disclosure provides a pumpless liquid-cooling heat dissipator, which uses the liquid refrigerant as a cooling medium, may have better water-cooling effect compared with the conventional water-cooling, and have better overall heat dissipation effect, can overcome the disadvantages of complex wiring of the water-cooling heat dissipator and poor heat dissipation of the heat pipe, and thus can quickly cool down the component temperature. Compared with the existing water-cooling heat dissipator, the structure is simpler, the circulating cooling can be realized without mechanical drive (e.g., water pump), and there is no extension of excess water pipe, which is more convenient for installation and makes the computer case cleaner.

Other features and advantages of the disclosure will be described in detail in the following specific embodiments.

BRIEF DESCRIPTION OF DRAWINGS

FIG. 4 is a schematic structural diagram of a pumpless liquid-cooling heat dissipator of the disclosure in a first from.

DETAILED DESCRIPTION OF EMBODIMENTS

The technical solutions in the embodiments of the disclosure will be clearly and completely described below in combination with the accompanying drawings used in the embodiments of the disclosure.

A pumpless liquid-cooling heat dissipator of the disclosure is mainly used in computers, which can quickly cool down a temperature of a processor (e.g., central processing unit (CPU)) and a temperature of an independent graphics card core (e.g., central processing unit (GPU)). Compared with the existing water-cooling heat dissipator, a structure of the pumpless liquid-cooling heat dissipator is simpler, the circulating cooling can be realized without mechanical drive (e.g., water pump), there is no extra water pipe extension, which makes the installation more convenient and makes the inside of a computer case cleaner. Of course, in accordance with the heat dissipation principle and structure of the disclosure, it can be manufactured and applied to equipment with different heat dissipation requirements, such as a small externally mounted heat dissipator specially applied to a mobile phone, so as to cope with the game jam caused by the heat generation of the mobile phone when playing games. Therefore, it should not be limited by the use objects.

Figure 1:
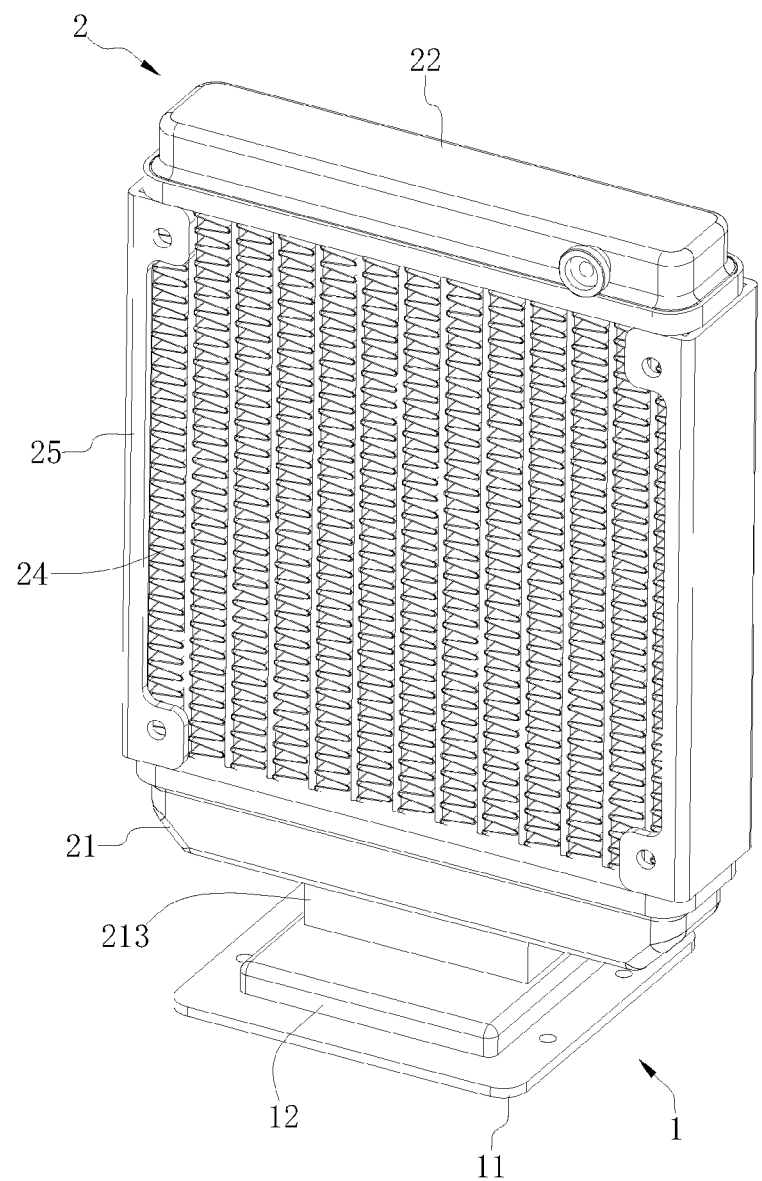
FIG. 1 is a three-dimensional structural diagram of a pumpless liquid-cooling heat dissipator of the disclosure.

Taking the cooling of the processor in the computer as an example, referring to FIG. 1, before use, a cooling head assembly 1 is installed on the processor so that the two are in full contact with each other, the cooling head assembly 1 constantly absorbs the heat emitted by the processor, so that the liquid refrigerant stored in the cooling head assembly 1 is constantly gasified to form a gaseous state. At this time, the liquid refrigerant in the cooling head assembly 1 becomes less and less, the liquid refrigerant in a condensing assembly 2 flows into the cooling head assembly 1 through the connecting assembly, while the gaseous refrigerant rises and enters the condensing assembly 2 through the connecting assembly, after cooling by the condensing assembly 2, the gaseous refrigerant is liquefied again and flows into the cooling head assembly 1 for circulation. It should be noted that the cooling head assembly 1 and the condensing assembly 2 connected to form a pathway will be reserved a part of the space for the transition of refrigerant gasification and liquefaction. The use of liquid refrigerant as a cooling medium may have better water-cooling effect compared with the conventional water-cooling and have better overall heat dissipation effect, can overcome the disadvantages of complex wiring of water-cooling heat dissipator and poor heat dissipation of heat pipe.

The following embodiment is illustrated for the condensing assembly, with reference to FIG. 1 through FIG. 4.

The condensing assembly 2 includes a lower tank 21, an upper tank 22 and multiple connecting pipes 23. The lower tank 21 is separated into a first half tank 211 and a second half tank 212, one half of the multiple connecting pipes 23 connect the first half tank 211 with the upper tank 22, and the other half of the multiple connecting pipes 23 connect the second half tank 212 with the upper tank 22. The cooling head assembly 1 is connected with the first half tank 211 and the second half tank 212 of the lower tank 21 individually. An outer wall of the lower tank 21 of the condensing assembly 2 is disposed with a connecting assembly. The connecting assembly is disposed with at least two refrigerant channels 214 connected with the cooling head assembly 1, some of the at least two refrigerant channels 214 is connected with the first half tank 211 of the lower tank 21, and the other of the at least two refrigerant channels 214 is connected with the second half tank 212 of the lower tank 21.

After the liquid refrigerant in the cooling head assembly 1 is gasified, it enters the lower tank 21 through the connecting assembly. An inner space of the lower tank 21 can be separated into two parts through a partition 215, namely, the first half tank 211 and the second half tank 212. The first half tank 211 and the second half tank 212 both have the liquid refrigerant in them, and the gasified refrigerant enters the first half tank 211 and rises to the connecting tubes 23, and the mixing of the gaseous refrigerant and the liquid refrigerant in the second half tank 212 is avoided by separating the lower tank 21 into two parts. A specific refrigerant flow path is: the gasified refrigerant enters the first half tank 211 through the refrigerant channel 214 in the connecting assembly. At this time, the liquid refrigerant flows into the cooling head assembly 1 from the second half tank 212 or the first half tank 211, while the gaseous refrigerant continues to rise and successively enters the connecting pipes 23 connected with the first half tank 211, then to the upper tank 22, and then to the connecting pipes 23 connected with the second half tank 212, after heat dissipation through the above path, the gasified refrigerant is liquefied again and enters the circulation.

Figure 4:
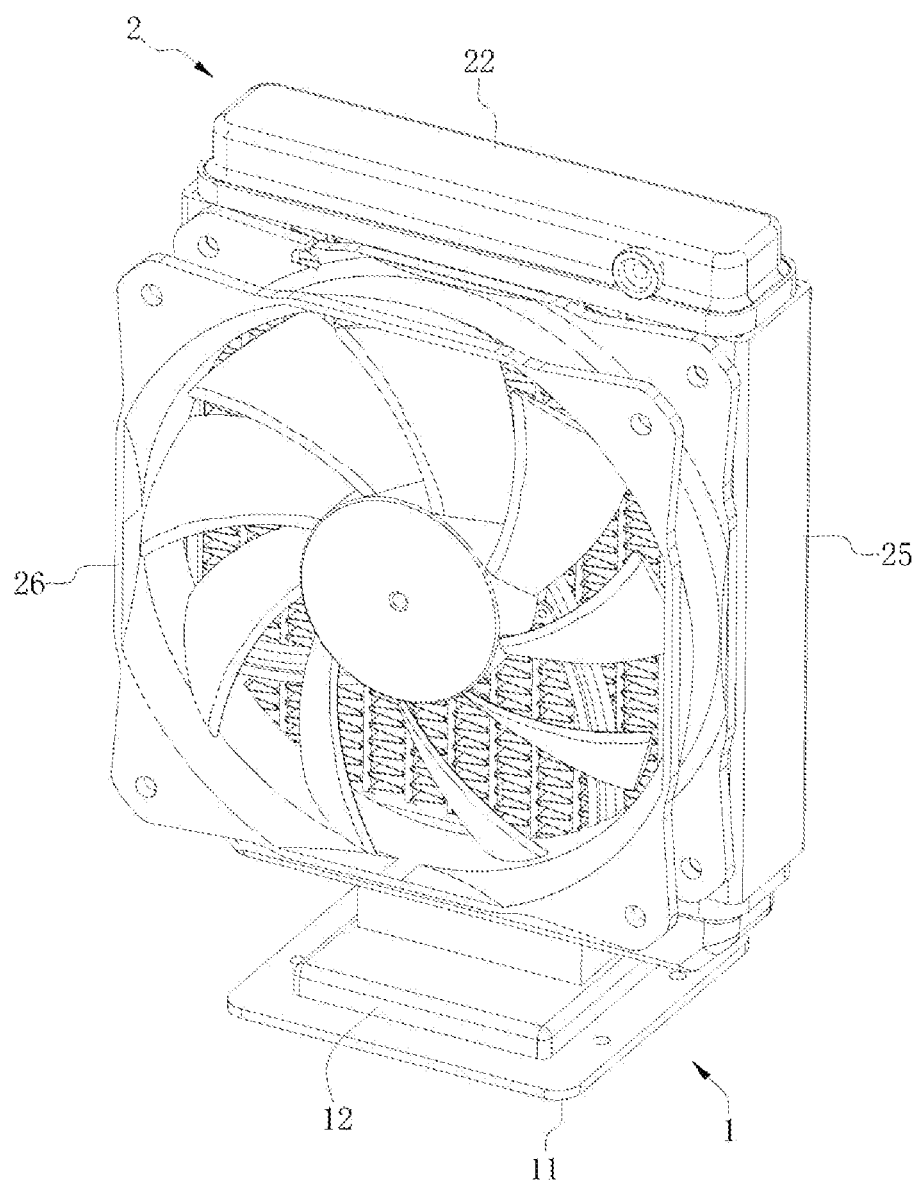

The condensing assembly 2 further includes multiple first fin groups 24, which are arranged between adjacent ones of the multiple connecting pipes 23, and the condensing assembly 2 further includes a fastener 25 for fastening the multiple connecting pipes 23 and the multiple first fin groups 24 together. At least one mounting position is formed on the fastener 25, a fan 26 is installed on the at least one mounting position, and an air outlet surface of the fan 26 faces towards the multiple connecting pipes 23 and the multiple first fin groups 24. In order to further improve the heat dissipation speed, the multiple first fin groups 24 are arranged between adjacent ones of the multiple connecting pipes 23, the multiple first fin groups 24 are in full contact with the multiple connecting pipes 23, so as to fully absorb the heat of the connecting pipes and accelerate the heat dissipation. In addition, in order to make the structure more compact, the fastener 25 can be installed on both sides of the condensing assembly 2, so that the multiple connecting pipes 23 and the multiple first fin groups 24 can be fastened and fixed. Further, at least one mounting position is arranged on the fastener 25 for installing the fan 26. In this embodiment, the air outlet surface of the fan 26 faces towards the multiple connecting pipes 23 and the multiple first fin groups 24 to further enhance the heat dissipation effect. It should be noted that multiple mounting positions can be set as needed, as shown in FIG. 4 and FIG. 5.

Figure 2:
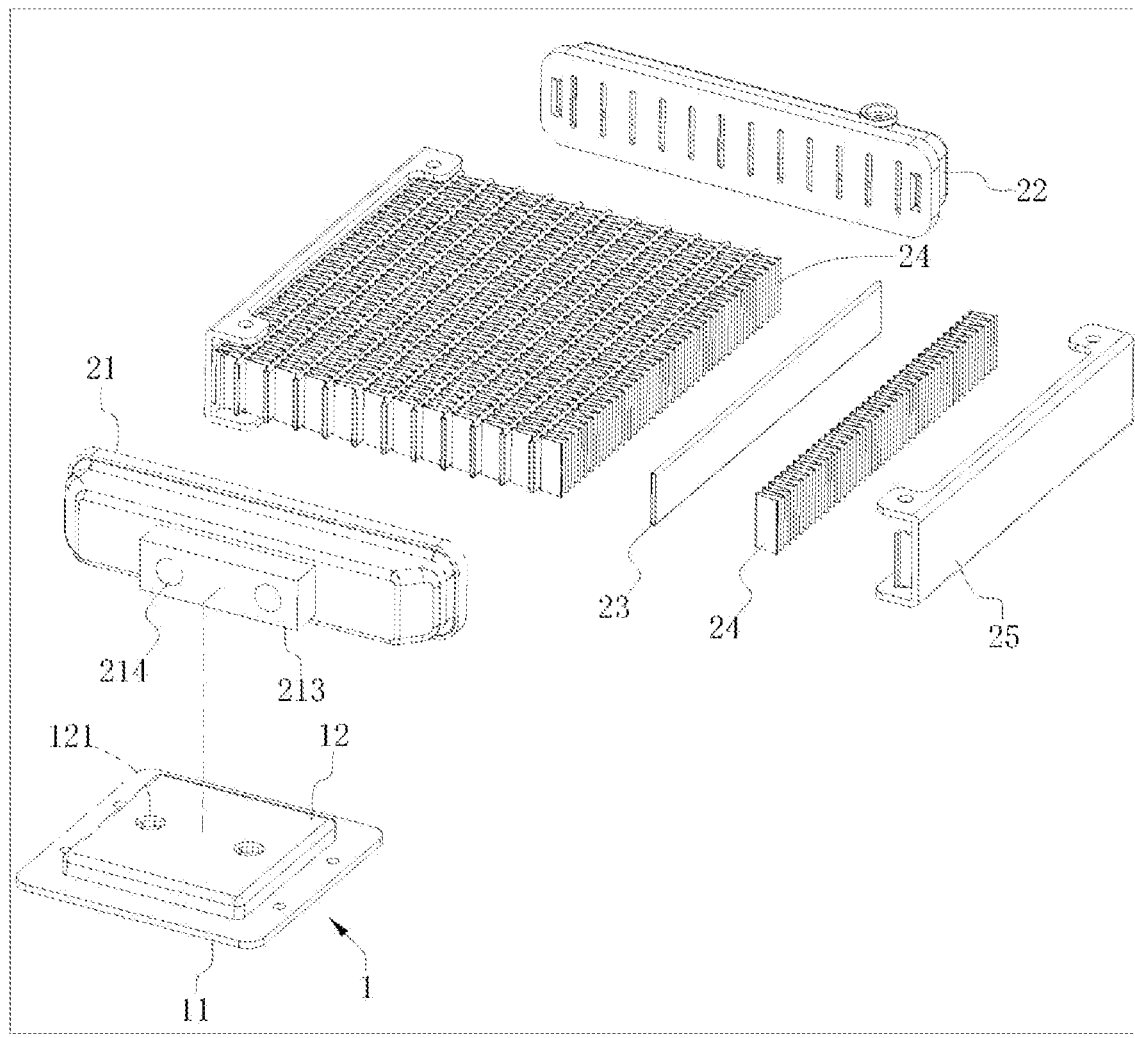
FIG. 2 is an exploded view of the pumpless liquid-cooling heat dissipator of the disclosure.
Figure 3:
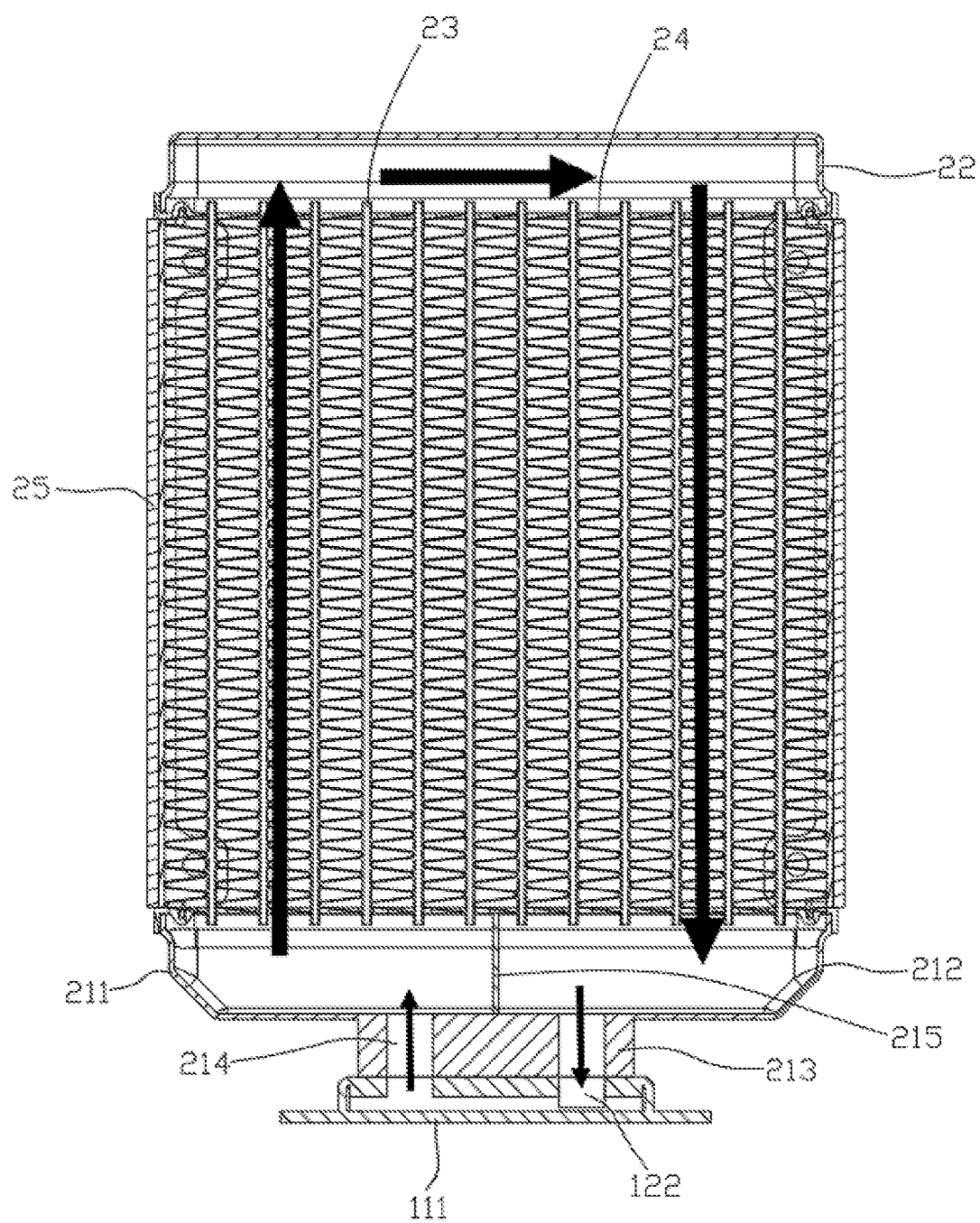
FIG. 3 is a sectional view of the pumpless liquid-cooling heat dissipator of the disclosure.

The heat dissipator of the disclosure has different shapes according to the structure of the connecting assembly, as follows:

For a first form, referring to FIG. 2 and FIG. 3, the connecting assembly includes a connecting part 213 extending downwardly from the outer wall of the lower tank 21, the refrigerant channels 214 are formed in the connecting part 213, the refrigerant channels 214 has several, some of the refrigerant channels 214 is connected with the first half tank 211 and the other of the refrigerant channels 214 is connected with the second half tank 212. This form is suitable for equipment with small heat dissipation demand, that is, the heat dissipator has one or two mounting positions, installed with one or two fans. Since the cooling head assembly 1 and the condensing assembly 2 are fixed to each other, a refrigerant inlet and outlet 121 including a refrigerant outlet 121a and a refrigerant inlet 121b in the cooling head assembly 1 can be directly connected to the refrigerant channels 214. The heat dissipator in this form does not need to provide additional mounting positions for the condensing assembly 2, making the overall installation more convenient.

Figure 5:
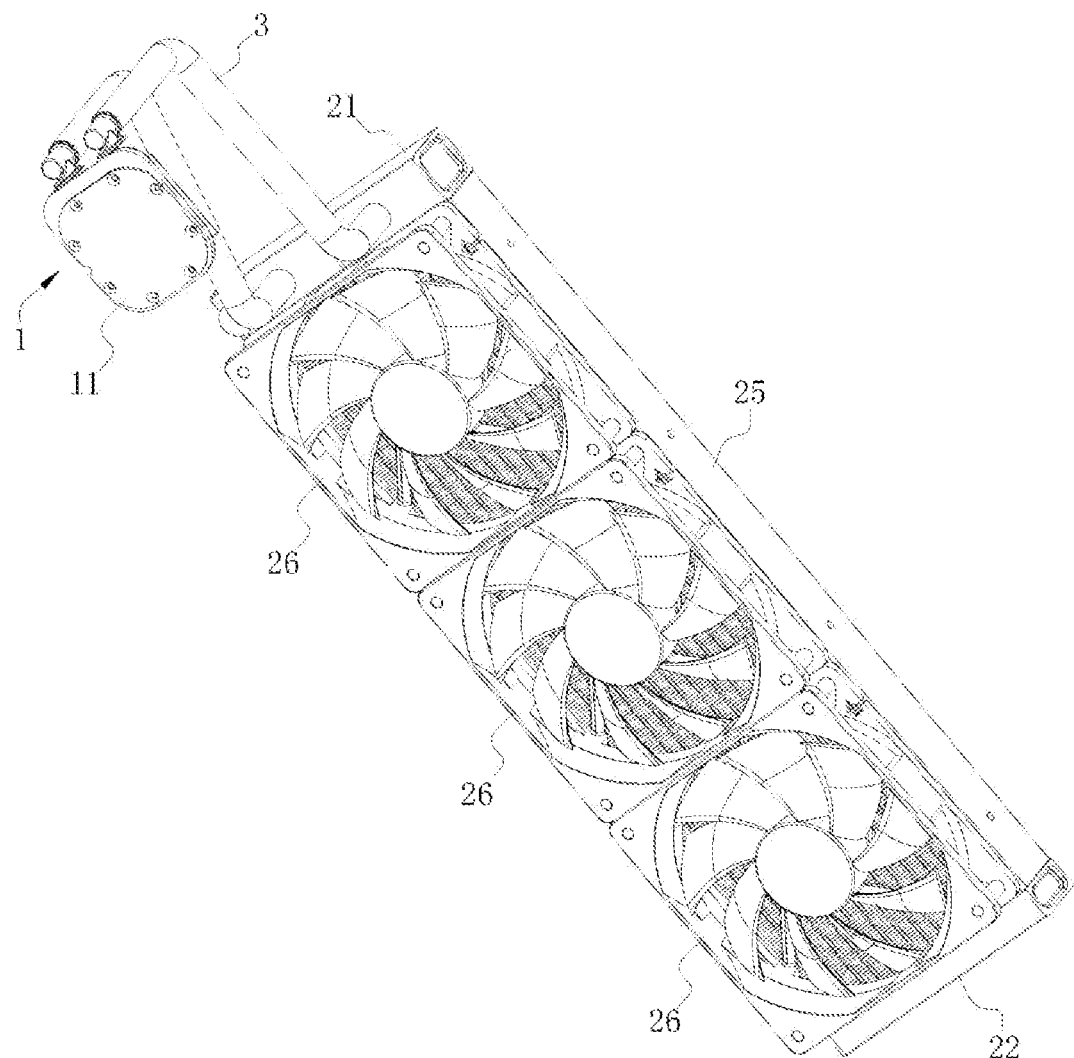
FIG. 5 is a schematic structural diagram of a pumpless liquid-cooling heat dissipator of the disclosure in a second form.
Figure 6:
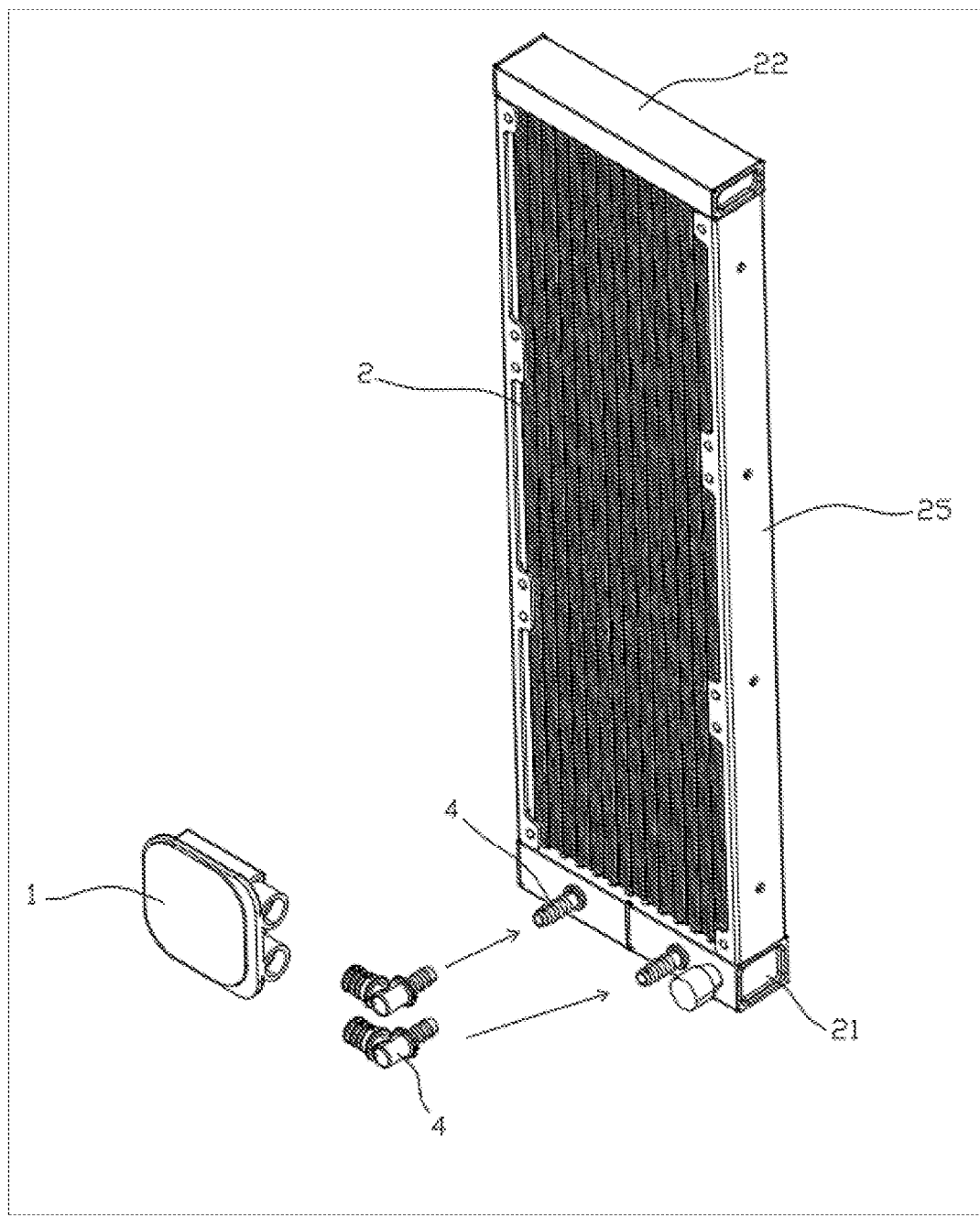
FIG. 6 is an exploded view of the pumpless liquid-cooling heat dissipator of the disclosure in a second form.
Figure 7:
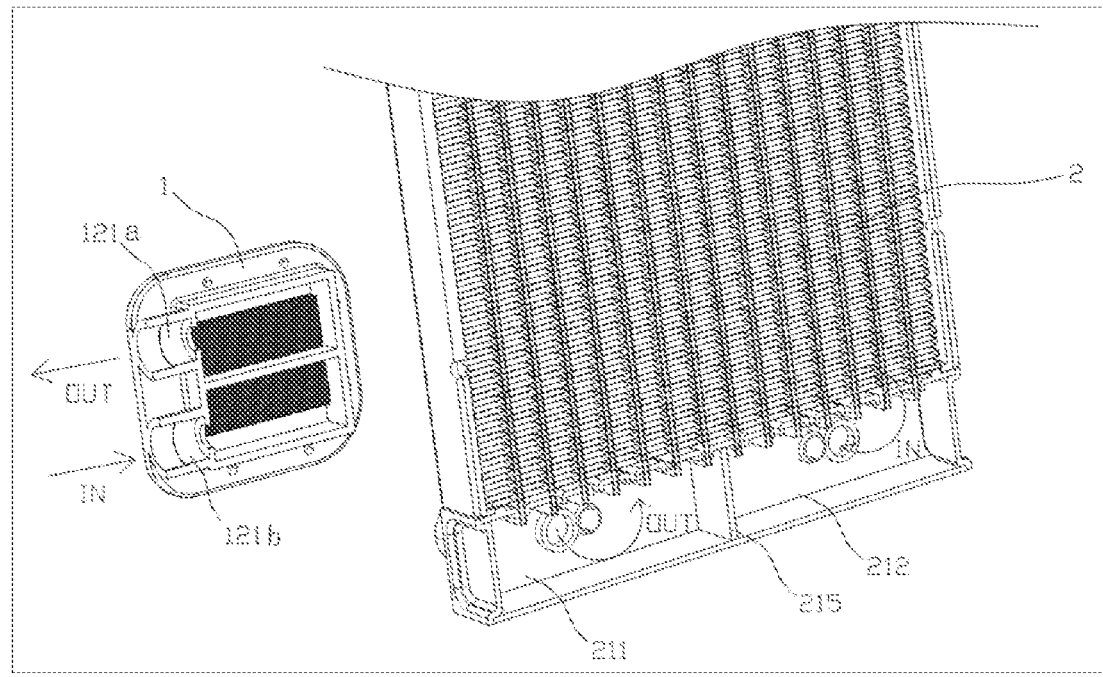
FIG. 7 is an internal structural diagram of the pumpless liquid-cooling heat dissipator of the disclosure in a second form.

For a second form, refer to FIG. 5-FIG. 7, in which FIG. 5 is a three-dimensional structural diagram of, FIG. 6 is an exploded view of the heat dissipator in the second form, and FIG. 7 is an internal structural diagram of the heat dissipator in the second form. The connecting assembly is disposed with at least two refrigerant tubes 3. Each refrigerant tube 3 is one refrigerant channel 214, in which some of the refrigerant tubes 3 is connected with the first half tank 211 and the other is connected with the second half tank 212. This form of the heat dissipator is suitable for equipment with large heat dissipation demand, that is, the heat dissipator has three or more mounting positions, installed with three or more fans. At this time, the first half tank 211 and the second half tank 212 are respectively threaded with quick-connectors 4 for connecting the refrigerant pipes 3 correspondingly, and the refrigerant outlet 121a and the refrigerant inlet 121b of the refrigerant head assembly 1 are respectively inserted with quick-connectors 4 for connecting the refrigerant pipes 3. During installation, it is necessary to use screws to fix the condensing assembly 2 at a position higher than the cooling head assembly 1, such as a top of the tank. The installation of the heat dissipator in this form is more troublesome than that in the first form, but it is easier to install than the water-cooling heat dissipator, and a volume of the heat dissipator in second form is larger, which has better heat dissipation effect.

The specific heat dissipation principle of the above two forms of heat dissipators is consistent with that in the previous embodiment, which will not be repeated here.

In addition, the cooling head assembly 1 includes a contact plate 11 and a housing 12, and the refrigerant outlet 121a and the refrigerant inlet 121b connected with the refrigerant channels 214 are formed on the housing 12. For the heat dissipator in the first form, as shown in FIG. 3, the heat dissipator is installed vertically, when the liquid refrigerant is heated and gasified, a pipe 122 extending towards the internal space is arranged at the refrigerant inlet 121b, and the pipe 122 is immersed in the liquid refrigerant, so most of the air bubbles formed will be discharged from the refrigerant outlet 121a to a part of the connecting pipes 23, then to the upper tank 22, and then move to another part of the connecting pipes 23 for cooling. This design increases the movement track of the gaseous refrigerant, which is conducive to heat dissipation and avoids excessive accumulation of gaseous refrigerant on a top of the heat dissipator.

For the installation of the heat dissipator in the second form, the cooling head assembly 1 in the heat dissipator of this form is suitable for vertical installation, that is, the refrigerant outlet 121a and the refrigerant inlet 121b in the cooling head assembly 1 are in the form of up and down. When the liquid refrigerant is heated and gasified, it will naturally go upwards from the refrigerant outlet 121a to refrigerant pipe 3, while the liquid refrigerant will enter the cooling head assembly 1 from the refrigerant inlet 121b lower below to supplement it, realizing no interference with each other.

Figure 8:
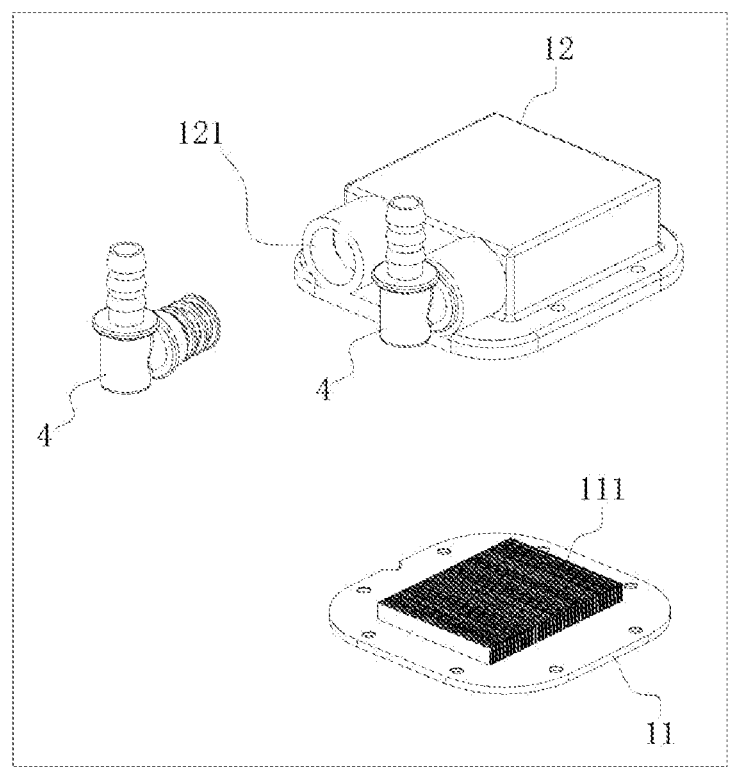
FIG. 8 is a schematic structural diagram of a cooling head assembly of the disclosure.

Referring to FIG. 6 and FIG. 8, a second fin group 111 (also referred to as an inner second fin group) is disposed on the contact plate 11, the liquid refrigerant is placed into a space formed by the housing 12 and the contact plate 11, and the setting of the second fin group 111 can improve the contact area between the contact plate 11 and the refrigerant, and thus improve the heat conduction efficiency between the contact plate 11 and the liquid refrigerant.

For those skilled in the art, it is obvious that the disclosure is not limited to the details of the above exemplary embodiments, and the disclosure can be realized in other specific forms without departing from the spirit or basic features of the disclosure. Therefore, no matter from which point of view, the embodiment should be regarded as exemplary and non-restrictive. The scope of the disclosure is limited by the appended claims rather than the above description. Therefore, it is intended to include all changes within the meaning and scope of the equivalent elements of the claims in the disclosure. Any reference numerals in the claims shall not be regarded as limiting the claims involved.

In addition, it should be understood that although the description is described according to the embodiments, not each embodiment contains only one independent technical solution. This description of the description is only for clarity. Those skilled in the art should take the description as a whole, and the technical solutions in each embodiment can also be properly combined to form other embodiments that can be understood by those skilled in the art.

What is claimed is:

1. A pumpless liquid-cooling heat dissipator, comprising a cooling head assembly (1) and a condensing assembly (2);
   wherein the cooling head assembly (1) and the condensing assembly (2) are connected through a connecting assembly to form a loop, and the cooling head assembly (1) and the condensing assembly (2) both are filled with a liquid refrigerant;
   wherein the condensing assembly (2) comprises a lower tank (21), an upper tank (22) and a plurality of connecting pipes (23);
   wherein the lower tank (21) is separated into a first half tank (211) and a second half tank (212), one half of the plurality of connecting pipes (23) connect the first half tank (211) with the upper tank (22), and the other half of the plurality of connecting pipes (23) connect the second half tank (212) with the upper tank (22);

wherein the cooling head assembly (1) is connected with the first half tank (211) and the second half tank (212) of the lower tank (21) individually;

wherein the connecting assembly is disposed on an outer wall of the lower tank (21) of the condensing assembly (2), the connecting assembly is disposed with at least two refrigerant channels (214) connected with the cooling head assembly (1), some of the at least two refrigerant channels (214) is connected with the first half tank (211) of the lower tank (21), and the other of the at least two refrigerant channels (214) is connected with the second half tank (212) of the lower tank (21);

wherein the cooling head assembly (1) comprises a contact plate (11) and a housing (12) formed integrally, the contact plate (11) and the housing (12) together define a space for storing the liquid refrigerant, and a refrigerant outlet (121a) and a refrigerant inlet (121b) correspondingly connected with the at least two refrigerant channels (214) are formed on the housing (12); and wherein the connecting assembly comprises a connecting part (213) extending downwardly from the outer wall of the lower tank (21), the at least two refrigerant channels (214) are formed in the connecting part (213), and the lower tank (21) is fixedly connected to the cooling head assembly (1).

2. The pumpless liquid-cooling heat dissipator according to claim 1, wherein the condensing assembly (2) further comprises a plurality of first fin groups (24), and the plurality of first fin groups (24) are arranged between adjacent ones of the plurality of connecting pipes (23).

3. The pumpless liquid-cooling heat dissipator according to claim 2, wherein the condensing assembly (2) further comprises a fastener (25) for fastening the plurality of connecting pipes (23) and the plurality of first fin groups (24) together.

4. The pumpless liquid-cooling heat dissipator according to claim 3, wherein at least one mounting position is formed on the fastener (25), and a fan (26) is installed on the at least one mounting position.

5. The pumpless liquid-cooling heat dissipator according to claim 4, wherein an air outlet surface of the fan (26) faces towards the plurality of connecting pipes (23) and the plurality of first fin groups (24).

6. The pumpless liquid-cooling heat dissipator according to claim 1, wherein a pipe (122) extending towards an internal space is arranged at the refrigerant inlet.

7. The pumpless liquid-cooling heat dissipator according to claim 1, wherein the connecting assembly comprises at least two refrigerant pipes (3).

8. The pumpless liquid-cooling heat dissipator according to claim 7, wherein the first half tank (211) and the second half tank (212) are respectively threaded with quick-connectors (4) for connecting the at least two refrigerant pipes (3) correspondingly.

9. The pumpless liquid-cooling heat dissipator according to claim 8, wherein the refrigerant outlet (121a) and the refrigerant inlet (121b) of the cooling head assembly (1) are respectively inserted with the quick-connectors (4) for connecting the at least two refrigerant channels.

10. The pumpless liquid-cooling heat dissipator according to claim 9, wherein the contact plate (11) of the cooling head assembly (1) is disposed with an inner second fin group (111).

* * * * *